United States Patent
Swaminathan et al.

(10) Patent No.: US 10,490,434 B2
(45) Date of Patent: *Nov. 26, 2019

(54) BIASABLE ROTATABLE ELECTROSTATIC CHUCK

(71) Applicant: APPLIED MATERIALS, INC., Santa Clara, CA (US)

(72) Inventors: Bharath Swaminathan, San Jose, CA (US); Anantha K. Subramani, San Jose, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 492 days.

This patent is subject to a terminal disclaimer.

(21) Appl. No.: 15/337,942

(22) Filed: Oct. 28, 2016

(65) Prior Publication Data

US 2017/0125274 A1    May 4, 2017

Related U.S. Application Data

(60) Provisional application No. 62/247,745, filed on Oct. 28, 2015.

(51) Int. Cl.
*H01T 23/00* (2006.01)
*H01L 21/683* (2006.01)
(Continued)

(52) U.S. Cl.
CPC .... *H01L 21/6833* (2013.01); *H01L 21/67115* (2013.01); *H01L 21/68785* (2013.01);
(Continued)

(58) Field of Classification Search
None
See application file for complete search history.

(56) References Cited

U.S. PATENT DOCUMENTS

| | | | |
|---|---|---|---|
| 4,170,541 A | 10/1979 | Lamont, Jr. | |
| 5,708,250 A | 1/1998 | Benjamin et al. | |

(Continued)

FOREIGN PATENT DOCUMENTS

JP    2003-133233 A    5/2003

OTHER PUBLICATIONS

International Search Report and Written Opinion dated Jan. 26, 2017 for PCT Application No. PCT/US2016/059500.

(Continued)

*Primary Examiner* — Stephen W Jackson
(74) *Attorney, Agent, or Firm* — Moser Taboada; Alan Taboada

(57) ABSTRACT

Embodiments of the present disclosure relate to a rotatable RF coupling device and an electrostatic chuck incorporating the same. In some embodiments, a rotatable RF coupling device includes a conductive plate; a rotatable split cylinder configured to be coupled to a dielectric disk of an electrostatic chuck to provide RF power to one or more RF bias electrodes disposed within the dielectric disk; a plurality of RF input taps coupled to the conductive plate to couple RF power to the conductive plate; a stationary ring coupled to the conductive plate and surrounding the rotatable split cylinder; and a grounded shield surrounding the conductive plate, the stationary ring, and the rotatable split cylinder.

20 Claims, 5 Drawing Sheets

(51) Int. Cl.
*H01R 39/60* (2006.01)
*H01L 21/67* (2006.01)
*H01L 21/687* (2006.01)
*H01R 39/64* (2006.01)

(52) U.S. Cl.
CPC ....... *H01L 21/68792* (2013.01); *H01R 39/60* (2013.01); *H01L 21/68742* (2013.01); *H01R 39/64* (2013.01)

(56) References Cited

U.S. PATENT DOCUMENTS

| | | | |
|---|---|---|---|
| 6,132,517 A * | 10/2000 | Sivaramakrishnan | ........................ C23C 14/568 118/715 |
| 2003/0169553 A1 | 9/2003 | Brown et al. | |
| 2012/0222618 A1 | 9/2012 | Olsen et al. | |
| 2013/0113169 A1 | 5/2013 | Sugi | |
| 2014/0290862 A1 | 10/2014 | Sugi | |
| 2015/0083042 A1 | 3/2015 | Kobayashi et al. | |
| 2015/0170952 A1 | 6/2015 | Subramani et al. | |

OTHER PUBLICATIONS

Supplementary European Search Report for EP Application No. 16860958 dated Feb. 5, 2019.

* cited by examiner

BIASABLE ROTATABLE ELECTROSTATIC CHUCK

CROSS-REFERENCE TO RELATED APPLICATIONS

This application claims benefit of U.S. provisional patent application Ser. No. 62/247,745, filed Oct. 28, 2015, which is herein incorporated by reference in its entirety.

FIELD

Embodiments of the present disclosure generally relate to electrostatic chucks used to retain substrates in microelectronic device fabrication processes.

BACKGROUND

Formation of some devices on substrates requires multiple layers of thin films which are deposited in a deposition chamber, such as a physical vapor deposition (PVD) chamber. In some embodiments, the substrate needs to be rotated during the deposition process to obtain good film uniformity. Deposition of some layers may also require the substrate to be heated. Further, the deposition process requires a high vacuum pressure. An electrostatic chuck is often used to electrostatically retain a substrate on a substrate support during the deposition process. Conventionally, an electrostatic chuck comprises a ceramic body having one or more electrodes disposed therein. Typical electrostatic chucks only move vertically up and down to facilitate substrate transfers. However, the inventors have observed that such a movement limitation prevents using these conventional electrostatic chucks for off-axis deposition due to non-uniform deposition on the substrate.

Therefore, the inventors have provided embodiments of an improved rotatable heated electrostatic chuck.

SUMMARY

Embodiments of the present disclosure relate to a rotatable RF coupling device and an electrostatic chuck incorporating the same. In some embodiments, a rotatable RF coupling device includes a conductive plate; a rotatable split cylinder configured to be coupled to a dielectric disk of an electrostatic chuck to provide RF power to one or more RF bias electrodes disposed within the dielectric disk; a plurality of RF input taps coupled to the conductive plate to couple RF power to the conductive plate; a stationary ring coupled to the conductive plate and surrounding the rotatable split cylinder; and a grounded shield surrounding the conductive plate, the stationary ring, and the rotatable split cylinder.

In some embodiments, an electrostatic chuck includes a dielectric disk having a support surface to support a substrate and an opposing second surface, wherein at least one chucking electrode is disposed within the dielectric disk; a lamp housing disposed below the dielectric disk and having a plurality of lamps to heat the dielectric disk; a metallic plate disposed below the lamp housing to absorb heat generated by the plurality of lamps; a rotatable radio frequency (RF) coupling device extending through the lamp housing and the metallic plate and coupled to the dielectric disk at a first end of the rotatable RF coupling device to support the dielectric disk in a spaced relation to the lamp housing; a shaft coupled to a second end of the rotatable RF coupling device at a first end of the shaft; and a rotation assembly coupled to the shaft to rotate the shaft, a portion of the RF coupling device, and the dielectric disk with respect to the lamp housing and the metallic plate.

In some embodiments, an electrostatic chuck includes a dielectric disk having a support surface to support a substrate and an opposing second surface, wherein at least one chucking electrode and one or more radio frequency (RF) bias electrodes are disposed within the dielectric disk; a lamp housing disposed below the dielectric disk and having a plurality of lamps to heat the dielectric disk; a metallic plate disposed below the lamp housing to absorb heat generated by the plurality of lamps; a rotatable radio frequency (RF) coupling device extending through the lamp housing and the metallic plate and coupled to the dielectric disk at a first end of the rotatable RF coupling device to support the dielectric disk in a spaced relation to the lamp housing; a shaft coupled to a second end of the rotatable RF coupling device at a first end of the shaft; a housing surrounding the lamp housing and the metallic plate; a gap disposed between an outer diameter of the metallic plate and an inner surface of the housing, wherein the gap is sized such that when the metallic plate absorbs heat from the plurality of lamps, thermal expansion of the metallic plate causes the outer diameter of the metallic plate to contact the inner surface of the housing; and a magnetic drive assembly coupled to the shaft to rotate the shaft, a portion of the RF coupling device, and the dielectric disk with respect to the lamp housing and the metallic plate. The rotatable RF coupling device includes a conductive plate; a rotatable split cylinder coupled to the dielectric disk to provide RF power to one or more RF bias electrodes disposed within the dielectric disk; a plurality of RF input taps coupled to the conductive plate to couple RF power to the conductive plate; a stationary ring coupled to the conductive plate and surrounding the rotatable split cylinder; and a grounded shield surrounding the conductive plate, the stationary ring, and the rotatable split cylinder.

Other and further embodiments of the disclosure are described in greater detail below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
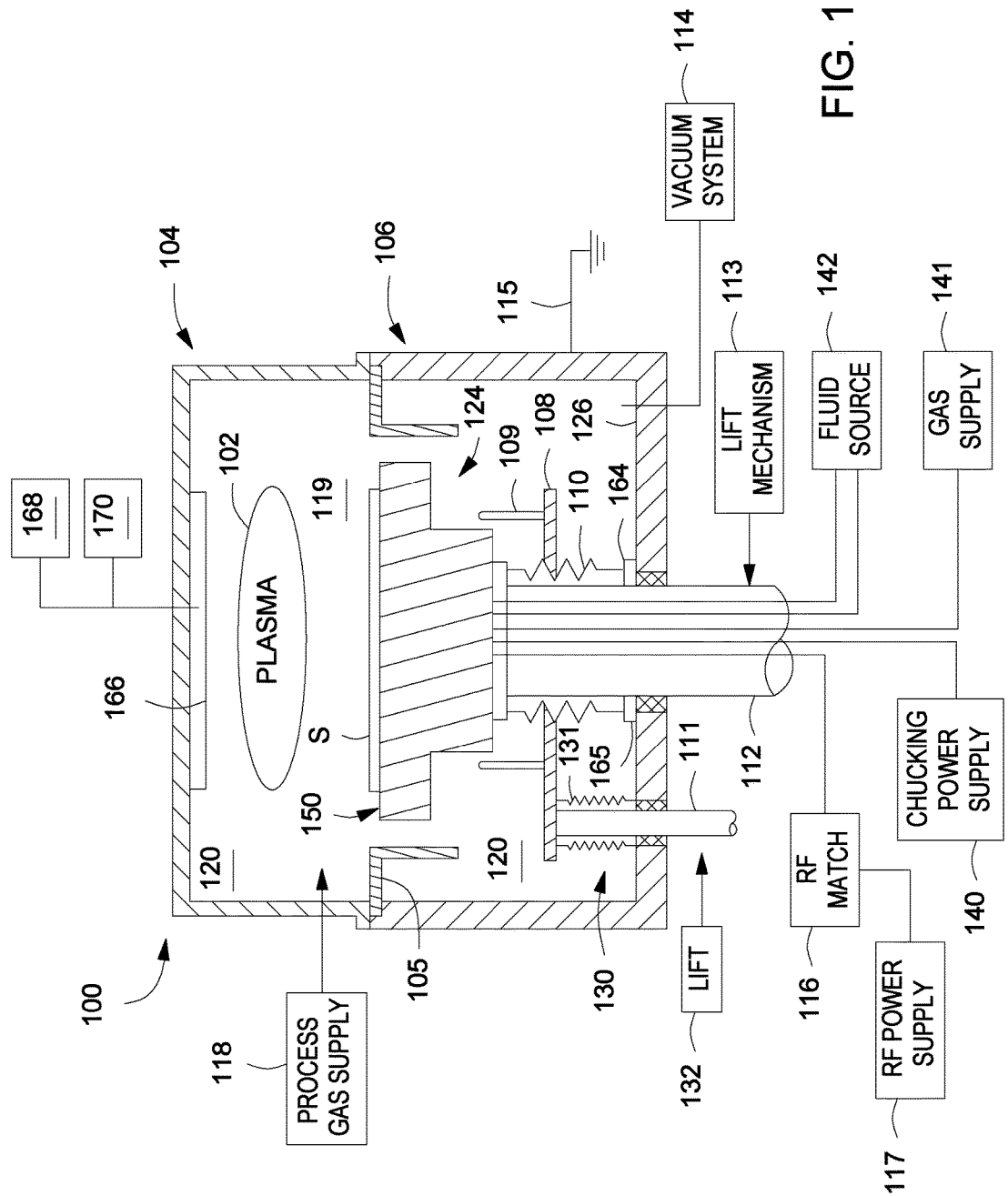
FIG. 1 depicts a schematic side view of process chamber suitable having an electrostatic chuck in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of rotatable RF coupling devices are provided herein. The inventive portable RF coupling devices may advantageously capacitively couple RF power to a rotating electrostatic chuck (ESC), thus improving deposition uniformity on a substrate to be processed.

FIG. 1 is a schematic cross-sectional view of plasma processing chamber in accordance with some embodiments of the present disclosure. In some embodiments, the plasma processing chamber is a physical vapor deposition (PVD) processing chamber. However, other types of processing chambers configured for different processes can also use or be modified for use with embodiments of the inventive electrostatic chuck described herein.

The chamber 100 is a vacuum chamber which is suitably adapted to maintain sub-atmospheric pressures within a chamber interior volume 120 during substrate processing. The chamber 100 includes a chamber body 106 covered by a lid 104 which encloses a processing volume 119 located in the upper half of chamber interior volume 120. The chamber 100 may also include one or more shields 105 circumscribing various chamber components to prevent unwanted reaction between such components and ionized process material. The chamber body 106 and lid 104 may be made of metal, such as aluminum. The chamber body 106 may be grounded via a coupling to ground 115.

A substrate support 124 is disposed within the chamber interior volume 120 to support and retain a substrate S, such as a semiconductor wafer, for example, or other such substrate as may be electrostatically retained. The substrate support 124 may generally comprise an electrostatic chuck 150 (described in more detail below with respect to FIGS. 2-4) and a hollow support shaft 112 for supporting the electrostatic chuck 150. The hollow support shaft 112 provides a conduit to provide, for example, process gases, fluids, coolants, power, or the like, to the electrostatic chuck 150.

In some embodiments, the hollow support shaft 112 is coupled to a lift mechanism 113, such as an actuator or motor, which provides vertical movement of the electrostatic chuck 150 between an upper, processing position (as shown in FIG. 1) and a lower, transfer position (not shown). A bellows assembly 110 is disposed about the hollow support shaft 112 and is coupled between the electrostatic chuck 150 and a bottom surface 126 of chamber 100 to provide a flexible seal that allows vertical motion of the electrostatic chuck 150 while preventing loss of vacuum from within the chamber 100. The bellows assembly 110 also includes a lower bellows flange 164 in contact with an o-ring 165 or other suitable sealing element which contacts bottom surface 126 to help prevent loss of chamber vacuum.

The hollow support shaft 112 provides a conduit for coupling a fluid source 142, a gas supply 141, a chucking power supply 140, and RF sources (e.g., RF plasma power supply 170 and RF bias power supply 117) to the electrostatic chuck 150. In some embodiments, RF plasma power supply 170 and RF bias power supply 117 are coupled to the electrostatic chuck via respective RF match networks (only RF match network 116 shown).

A substrate lift 130 may include lift pins 109 mounted on a platform 108 connected to a shaft 111 which is coupled to a second lift mechanism 132 for raising and lowering the substrate lift 130 so that the substrate "S" may be placed on or removed from the electrostatic chuck 150. The electrostatic chuck 150 includes thru-holes (described below) to receive the lift pins 109. A bellows assembly 131 is coupled between the substrate lift 130 and bottom surface 126 to provide a flexible seal which maintains the chamber vacuum during vertical motion of the substrate lift 130.

The chamber 100 is coupled to and in fluid communication with a vacuum system 114 which includes a throttle valve (not shown) and vacuum pump (not shown) which are used to exhaust the chamber 100. The pressure inside the chamber 100 may be regulated by adjusting the throttle valve and/or vacuum pump. The chamber 100 is also coupled to and in fluid communication with a process gas supply 118 which may supply one or more process gases to the chamber 100 for processing a substrate disposed therein.

In operation, for example, a plasma 102 may be created in the chamber interior volume 120 to perform one or more processes. The plasma 102 may be created by coupling power from a plasma power source (e.g., RF plasma power supply 170) to a process gas via one or more electrodes proximate to or within the chamber interior volume 120 to ignite the process gas and creating the plasma 102. In some embodiments, a bias power may also be provided from a bias power supply (e.g., RF bias power supply 117) to one or more electrodes (described below) disposed within the electrostatic chuck 150 via a capacitively coupled bias plate (described below) to attract ions from the plasma towards the substrate S.

In some embodiments, for example where the chamber 100 is a PVD chamber, a target 166 comprising a source material to be deposited on a substrate S may be disposed above the substrate and within the chamber interior volume 120. The target 166 may be supported by a grounded conductive portion of the chamber 100, for example an aluminum adapter through a dielectric isolator. In other embodiments, the chamber 100 may include a plurality of targets in a multi-cathode arrangement for depositing layers of different material using the same chamber.

A controllable DC power source 168 may be coupled to the chamber 100 to apply a negative voltage, or bias, to the target 166. The RF bias power supply 117 may be coupled to the substrate support 124 in order to induce a negative DC bias on the substrate S. In addition, in some embodiments, a negative DC self-bias may form on the substrate S during processing. In some embodiments, an RF plasma power supply 170 may also be coupled to the chamber 100 to apply RF power to the target 166 to facilitate control of the radial distribution of a deposition rate on substrate S. In operation, ions in the plasma 102 created in the chamber 100 react with the source material from the target 166. The reaction causes the target 166 to eject atoms of the source material, which are then directed towards the substrate S, thus depositing material.

Figure 2:
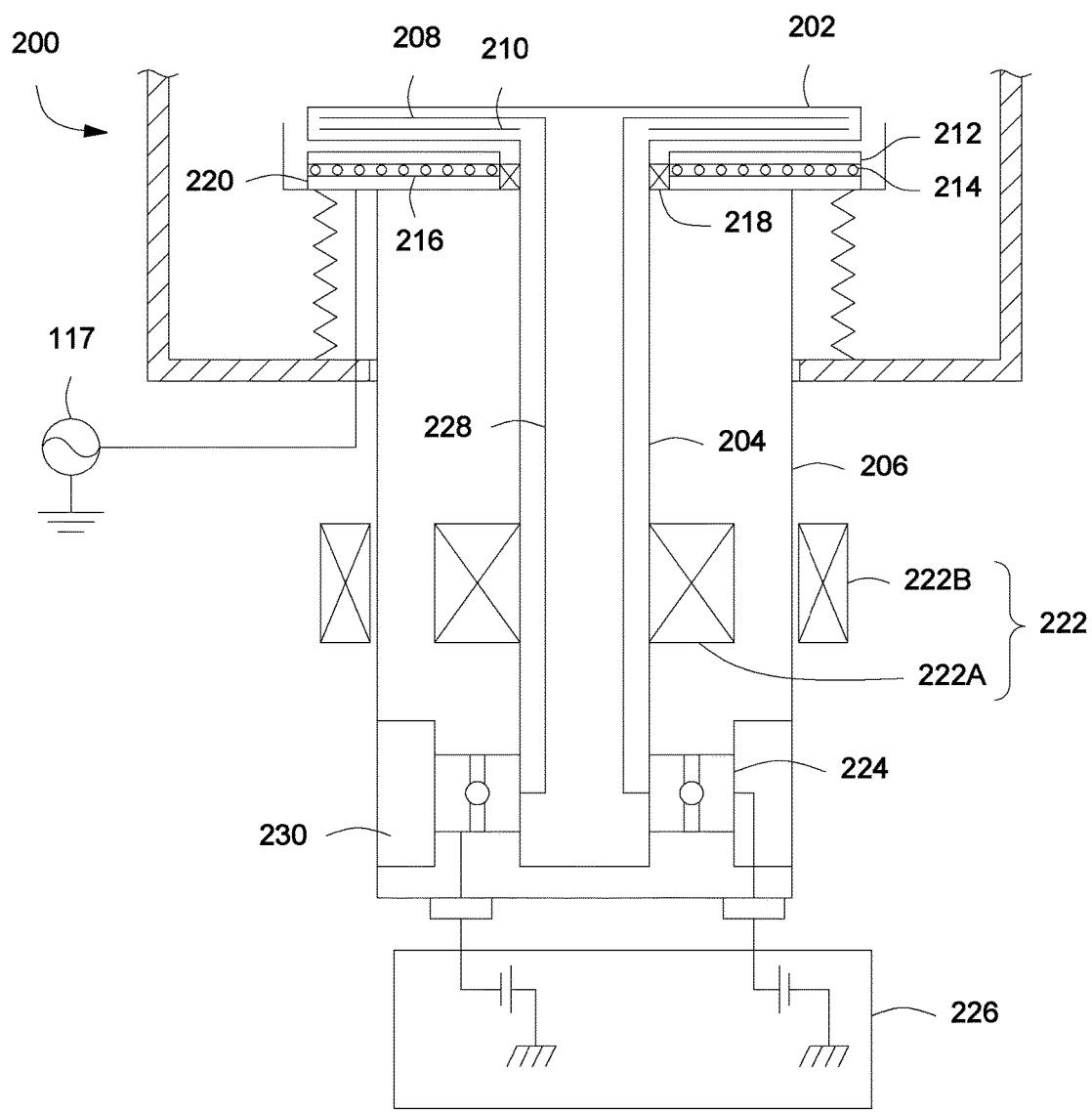
FIG. 2 depicts a schematic side cross sectional view of an electrostatic chuck in accordance with at least some embodiments of the present disclosure.

FIG. 2 depicts a cross-sectional view of an electrostatic chuck (chuck 200) in accordance with embodiments of the present disclosure. The chuck 200 includes a disk 202, a shaft 204 extending from the bottom of the disk 202, and a housing 206 enclosing the disk 202, the shaft 204, and other components (described below) of the chuck 200.

The disk 202 is formed of a dielectric material, such as a ceramic material, for example, aluminum nitride, aluminum oxide, boron nitride, alumina doped with titanium oxide, and the like. The disk 202 includes one or more chucking electrodes 208 disposed near an upper surface of the disk 202. The disk 202 includes a support surface to support a substrate (not shown) and an opposing second surface. The one or more chucking electrodes 208 are fabricated from a suitable conductive material, such as molybdenum, titanium, or the like. The one or more chucking electrodes 208 may be arranged in any configuration that will sufficiently secure the substrate to the upper surface of the disk during processing. For example, the one or more chucking electrodes 208 may be arranged to provide a single electrode electrostatic chuck, a bipolar electrostatic chuck, or the like.

As noted above, the disk 202 may also include one or more RF bias electrodes 210. The one or more RF bias electrodes 210 are capacitively coupled to RF power to attract ions from the plasma towards the substrate disposed on the disk 202. Power is delivered to the RF bias electrodes 210 via a rotatable RF coupling device 300 (described below) that receives power from an external RF power source (e.g., RF bias power supply 117). The rotatable RF coupling device 300 is capacitively coupled to the RF bias electrodes 210, thus removing any direct electrical coupling across a conductor. Accordingly, power can be delivered to the RF bias electrodes 210 while the disk 202 is being rotated.

To facilitate heating of the disk 202 and a substrate when disposed thereon, the chuck 200 includes a plurality of lamps 214. The plurality of lamps 214 may be disposed in a lamp cage 211 including a lamp housing 216 that houses the plurality of lamps 214 and an RF shield 212 (e.g., a Faraday cage) disposed above the plurality of lamps 214 to shield the lamps from RF energy. The lamp housing 216 is formed of a material capable of withstanding the heat of the plurality of lamps 214. For example, the lamp housing 216 may be formed of a ceramic material. The plurality of lamps 214 include any type of lamp capable of emitting enough heat to heat the disk 202 via radiation. For example, the plurality of lamps 214 may include halogen lamps.

The RF shield 212 is designed to allow heat generated by the plurality of lamps 214 to reach the disk 202 through the RF shield 212. For example, in some embodiments, the RF shield may include openings 213 disposed over each lamp 214. Alternatively, in some embodiments, the RF shield may be a mesh that allows heat to pass through the mesh while shielding the lamps 214 from RF energy. Thus the RF shield 212 advantageously prevents or limits RF energy coupling to the plurality of lamps 214 while allowing heat energy from the plurality of lamps 214 to reach the disk 202. In some embodiments, the RF shield 212 is formed of molybdenum, for example for use at temperatures of up to about 750° C., or polished aluminum, for example for use at temperatures of up to about 250° C. The RF shield 212 may be held in place by a clamp 236. For example, the clamp 236 may include an outer mounting ring 232 and an inner mounting ring 234 that can each be bolted or otherwise secured to the lamp housing 216 while clamping or retaining the RF shield 212 in place.

The chuck 200 may also include a bearing 218 located proximate to the disk 202 (for example, within about 3 inches of the disk 202) to provide increased rigidity to the chuck 200 during rotation. The bearing 218 may include, for example, a cross roller bearing, or the like. A metallic plate 220 is disposed beneath the lamp housing 216 to conduct heat away from the bearing 218, which could otherwise cause the bearing to expand and eventually seize. The metallic plate 220 may be formed of any process compatible metal or metal alloy such as, for example, aluminum. The metallic plate 220 is sized so that a gap is disposed between an outer edge of the metallic plate 220 and an inner surface of the housing 206. During operation of the chuck 200, the heat generated by the plurality of lamps 214 heats the metallic plate 220 causing the metallic plate 220 to thermally expand such that the outer diameter, or edge, of the metallic plate 220 contacts the inner surface of the housing 206. Upon contacting the inner surface of the housing 206, the metallic plate 220 readily transfers heat to the housing 206 through conduction. Fluid channels (described below) may be disposed in the housing 206 to flow a heat transfer fluid (e.g., a coolant) to cool the housing 206.

The chuck 200 further includes a rotation assembly (i.e., magnetic drive assembly 222) to rotate the disk 202. The magnetic drive assembly 222 includes an inner magnet 222A and an outer magnet 222B. The inner magnet 222A is attached, or fixed, to the shaft 204. In some embodiments, the inner magnet 222A is attached to a lower portion of the shaft 204 proximate an end of the shaft 204 opposite the disk 202. The outer magnet 222B is disposed outside of the housing 206 proximate to the inner magnet 222A. The outer magnet 222B may be driven by a suitable mechanism, for example by a belt drive or a motor, to drive the inner magnet 222A, and the shaft 204 and the disk 202. Because the inner magnet 222A is disposed within the housing 206, the inner magnet 222A is at vacuum pressure and because the outer magnet 222B is disposed outside of the housing 206, the outer magnet 222B is at atmospheric pressure. However, both the inner magnet 222A and the outer magnet 222B may instead be disposed within the housing 206. Thus, the magnetic drive assembly 222 rotates the disk 202 and the shaft 204 with respect to the process chamber and the remaining components of the chuck 200 which remain stationary (e.g., the housing 206, the lamp cage 211, the metallic plate 220, and the like). Alternatively, the magnetic drive assembly 222 can use other configurations to rotate the disk 202 and the shaft 204. For example, in some embodiments, the inner magnet 222A and the outer magnet 222B can function respectively as a rotor and stator with a conductor wrapped around the stator to electromagnetically drive the rotor.

The chuck 200 also includes a bearing assembly 224 located at an end of the shaft 204 opposite the disk 202. The bearing assembly 224 supports the shaft 204 and facilitates rotation of the shaft 204. In addition, the inventors have provided an improved way to route power to the chucking electrodes 208 through the bearing assembly 224 to facilitate providing power to the chucking electrodes 208 while rotating the chuck 200. Power is drawn from a DC power source 226 through connections in the housing 206 and routed to the bearing assembly 224. Current flows through the bearing assembly 224 and is subsequently routed to the chucking electrodes 208 via chucking power lines 228 disposed within an interior of the shaft 204. In order to avoid any interference with the chucking power supply (e.g., the DC power source 226), the bearing assembly may be coupled to an insulator 230, which is coupled to an interior of the housing 206.

Figure 3A:
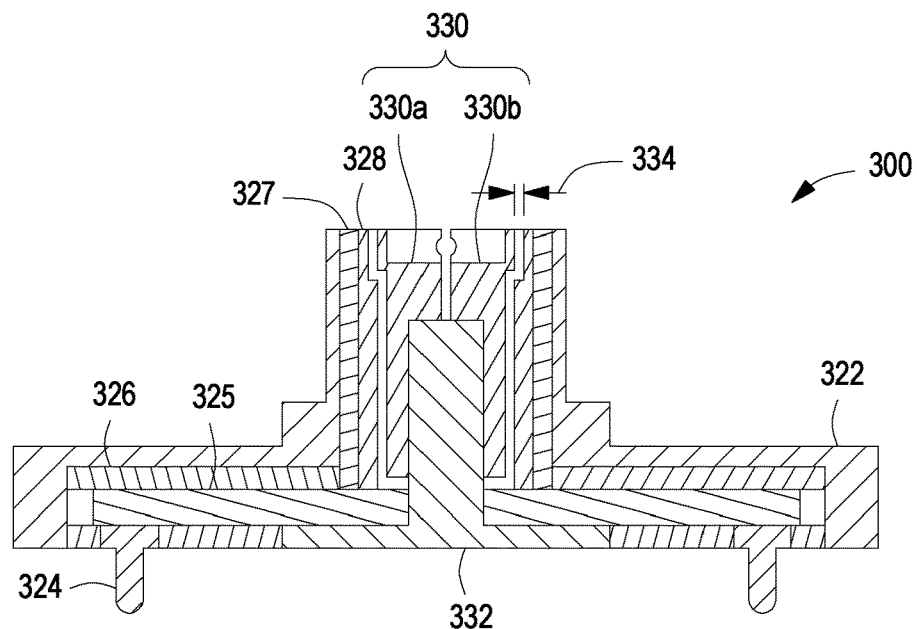
FIG. 3A depicts a cross sectional view of a rotatable RF coupling device in accordance with at least some embodiments of the present disclosure.
Figure 3B:
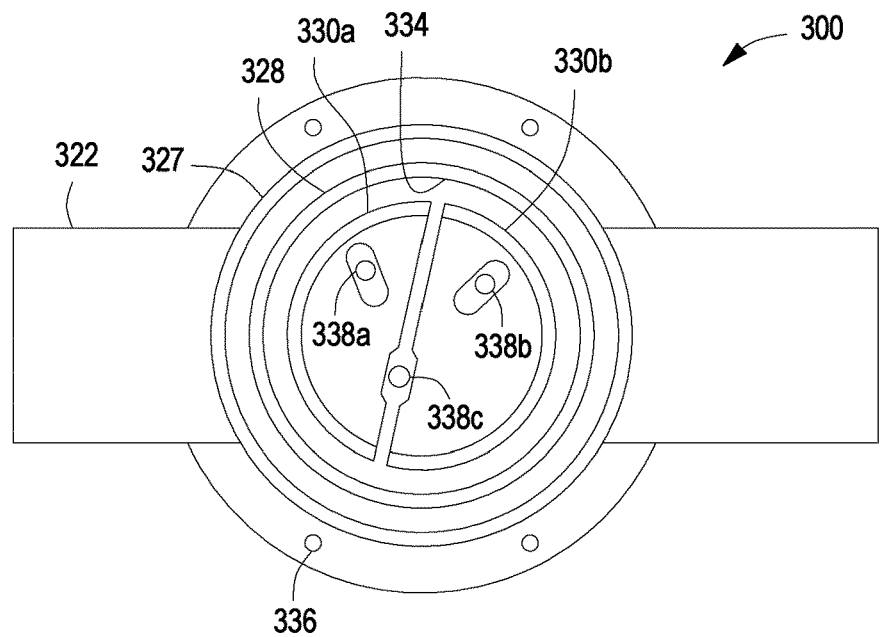
FIG. 3B depicts a top view of a rotatable RF coupling device in accordance with at least some embodiments of the present disclosure.

FIG. 3A depicts a cross sectional view of the rotatable RF coupling device 300 (hereinafter "the coupling device 300") in accordance with some embodiments of the present disclosure. FIG. 3B depicts a top view of the coupling device 300. The coupling device 300 includes grounded shield 322, inside of which are disposed a plurality of RF input taps 324

(two shown) coupled to a conductive plate 325, a conductive stationary ring 328 coupled to the conductive plate 325, and a conductive rotatable split cylinder 330 having a first half $330_a$ and a second half $330_b$. The plurality of RF input taps 324 are electrically coupled to RF bias power supply 117 and RF match network 116, for example, by one or more RF cables routed from the RF input taps 324 out of the chamber and to the RF match network 116 or some other component electrically coupled to the RF match network 116. One or more dielectric insulators 326, 327 are disposed between the shield 322 and the conductive plate 325 and the stationary ring 328 to prevent arcing.

The rotatable RF coupling device 300 receives power from the RF bias power supply 117 or from another power source (not shown) via the RF input taps 324. The ceramic cylinder 332 disposed beneath the rotatable split cylinder 330 advantageously prevents interference with the chucking power supply from the RF waves.

A gap 334 is formed between the stationary ring 328 and the rotatable split cylinder 330. In some embodiments, the gap 334 has a width of about 0.003 inches to about 0.01 inches. During use, RF power flows through the plurality of RF input taps 324 through the conductive plate 325 through the stationary ring 328 and across the gap 334 to couple RF energy to the rotatable split cylinder 330, which is coupled to disk 202 containing the one or more chucking electrodes 208 and the RF bias electrodes 210. The inventors have discovered that the capacitive coupling of the RF energy across the gap 334 advantageously allows for RF coupling that is isolated and surrounded by ground potentials to prevent arcing or discharging. The inventors have also discovered that the capacitive losses are between about 10-15% of the RF power supplied to the plurality of RF input taps 324.

The coupling device 300 may include a plurality of electrical taps to couple power to the chucking electrode in the disk 202. For example, as depicted in FIG. 3B, three electrical taps: a first, second, and third electrical taps $338_a$, $338_b$, and $338_c$ extend through the rotatable split cylinder 330. The first electrical tap $338_a$ disposed in the first half $330_a$ may carry a positive or negative voltage whereas the second electrical tap $338_b$ disposed in the second half $330_b$ carries a voltage with polarity opposite that of the electrical tap $338_a$. The third electrical tap $338_c$ acts as a floating potential and is not coupled to a power supply. The split cylinder 330 is coupled to the chucking power supply to supply the electrical taps with DC power for the chucking electrodes 308. The shield 322 may include a plurality of through holes 336 through which fixation elements (screws, bolts, etc.) may extend to couple the rotatable RF coupling device 300 to the bearing 218

Figure 3C:
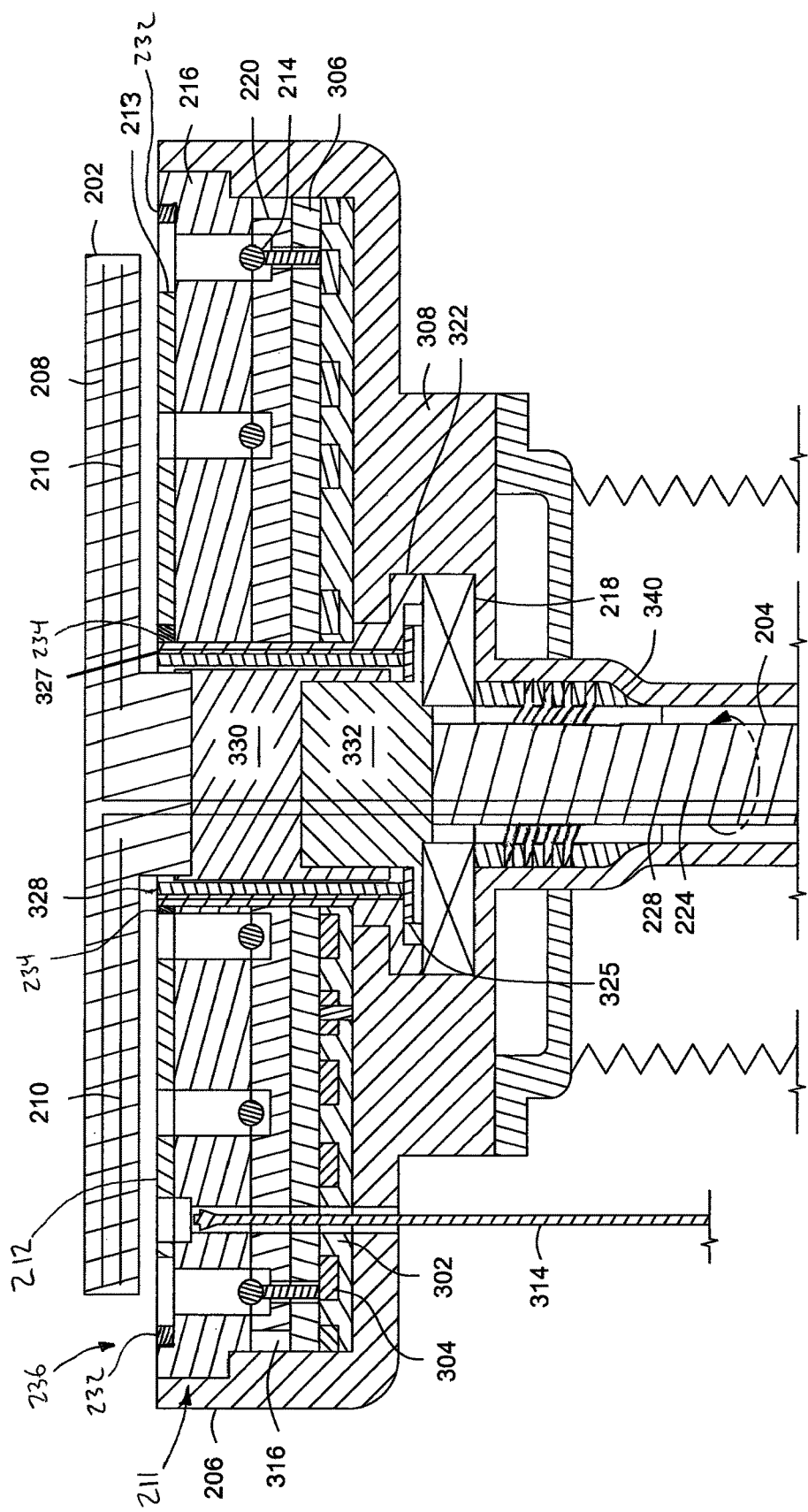
FIG. 3C depicts a cross sectional view of an upper portion of an electrostatic chuck having a rotatable RF coupling device in accordance with at least some embodiments of the present disclosure.
Figure 4:
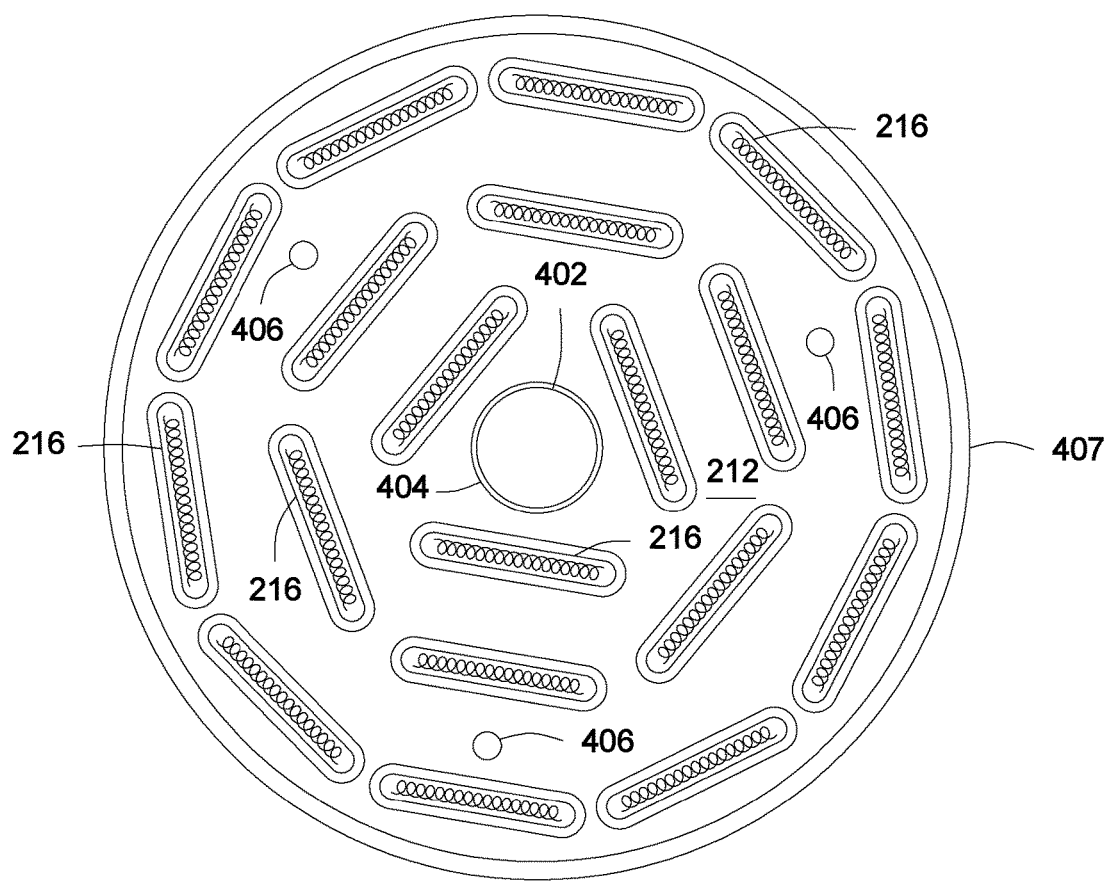
FIG. 4 depicts a top view of a lamp cage of a substrate heating apparatus in accordance with at least some embodiments of the present disclosure.

FIG. 3C depicts a cross sectional view of the chuck 200 including the rotatable RF coupling device 300. The plurality of lamps 214 receive power from a plurality of conductors 304 disposed in a dielectric plate 302, such as a ceramic plate. The conductors 304 may receive power from the DC power source 226. In some embodiments, a dielectric layer 306 may be disposed atop the dielectric plate 302 to protect the conductors 304 and prevent inadvertent contact between the conductors 304 and any other conductive elements of the chuck 200. Openings in the dielectric layer 306 are provided to facilitate coupling the conductors 304 to respective lamps 214. The rotatable RF coupling device 300 extends through the lamp housing 216 and the metallic plate 220 and coupled to the disk 202 at a first end of the rotatable RF coupling device 300 to support the disk 202 in a spaced relation to the lamp housing 216. In some embodiments, the plurality of lamps may be divided into a plurality of zones, for example, an inner array of lamps and an independently controllable outer array of lamps, as illustrated in FIG. 4.

As explained above, upon activation of the plurality of lamps 214, heat is generated and the disk 202 is heated. Because the heat is emitted in every direction, and not only towards the disk 202, the metallic plate 220 is disposed below the lamp housing 216 to absorb the heat. During the absorption process, the metallic plate 220 expands and begins to extend into a gap 316 between an outer edge of the metallic plate 220 and the housing 206. Upon contacting the housing 206, the metallic plate 220 transfers heat to the housing 206. To keep the housing 206 cool, a plurality of fluid channels may be formed in the housing 206. Any suitable coolant (e.g., water, propylene glycol, or the like) may be flowed through the fluid channels to cool the housing 206.

In some embodiments, the chuck 200 may include a torsion spring 340 to ensure proper alignment of the coupling device 300 with the remainder of the chuck 200. In order to facilitate placement and removal of a substrate on the disk 202, the chuck 200 may also include a lift pin assembly including a plurality of lift pins 314 to raise and lower a substrate off of or onto the disk 202. In some embodiments, at least one of the plurality of lift pins 314 may include a pyrometer to measure the temperature of the disk 202. A region of the disk 202 disposed opposite the lift pins 314 may be treated to have a very high emissivity to facilitate monitoring the temperature of the disk 202 by the pyrometer FIG. 4 depicts a top view of a lamp cage in accordance with some embodiments of the present disclosure. As explained above, the RF shield (RF shield 212 shown in FIG. 2) of the lamp cage allows heat generated by the plurality of lamps 214 to heat the disk 202. Due to the nature of the RF shield, and in particular embodiments where the RF shield is a mesh, the RF shield is not shown in the top view of FIG. 4 so as not to obscure the remaining details. In some embodiments, the RF shield, or mesh, may be held in place by an inner mounting ring 404 and an outer mounting ring 407. The RF shield 212 and the lamp housing 216 also include a central hole 402 to allow the shaft 204 to pass through the central hole 402 and a plurality of holes 406 to allow the plurality of lift pins 314 to pass through the plurality of holes 406. Although shown as slots arranged in a particular configuration, the shape and number of the openings, as well as the shape and number of the lamps, may be varied to provide a desired heat profile on the disk 202.

While the foregoing is directed to embodiments of the present disclosure, other and further embodiments of the disclosure may be devised without departing from the basic scope thereof.

The invention claimed is:

1. A rotatable radio frequency (RF) coupling device, comprising:
    a conductive plate;
    a rotatable split cylinder configured to be coupled to a dielectric disk of an electrostatic chuck to provide RF power to one or more RF bias electrodes disposed within the dielectric disk;
    a plurality of RF input taps coupled to the conductive plate to couple RF power to the conductive plate;
    a stationary ring coupled to the conductive plate and surrounding the rotatable split cylinder; and
    a grounded shield surrounding the conductive plate, the stationary ring, and the rotatable split cylinder.

2. The rotatable RF coupling device of claim 1, further comprising:
one or more insulators disposed between the grounded shield, the conductive plate, and the stationary ring.

3. The rotatable RF coupling device of claim 1, further comprising:
a gap disposed between the stationary ring and the rotatable split cylinder to facilitate capacitive coupling of RF power from the stationary ring to the rotatable split cylinder.

4. The rotatable RF coupling device of claim 3, further comprising:
a plurality of electrical taps extending through the rotatable split cylinder and configured to be coupled to at least one chucking electrode.

5. The rotatable RF coupling device of claim 4, wherein the plurality of electrical taps includes three electrical taps, and wherein a first electrical tap carries positive voltage, a second electrical tap carried negative voltage, and a third electrical tap is electrically floating.

6. An electrostatic chuck, comprising:
a dielectric disk having a support surface to support a substrate and an opposing second surface, wherein at least one chucking electrode is disposed within the dielectric disk;
a lamp housing disposed below the dielectric disk and having a plurality of lamps to heat the dielectric disk;
a metallic plate disposed below the lamp housing to absorb heat generated by the plurality of lamps;
a rotatable radio frequency (RF) coupling device extending through the lamp housing and the metallic plate and coupled to the dielectric disk at a first end of the rotatable RF coupling device to support the dielectric disk in a spaced relation to the lamp housing;
a shaft coupled to a second end of the rotatable RF coupling device at a first end of the shaft; and
a rotation assembly coupled to the shaft to rotate the shaft, a portion of the RF coupling device, and the dielectric disk with respect to the lamp housing and the metallic plate.

7. The electrostatic chuck of claim 6, wherein the electrostatic chuck is a bipolar electrostatic chuck.

8. The electrostatic chuck of claim 6, wherein the rotatable RF coupling device comprises:
a conductive plate;
a rotatable split cylinder coupled to the dielectric disk to provide RF power to one or more RF bias electrodes disposed within the dielectric disk;
a plurality of RF input taps coupled to the conductive plate to couple RF power to the conductive plate;
a stationary ring coupled to the conductive plate and surrounding the rotatable split cylinder; and
a grounded shield surrounding the conductive plate, the stationary ring, and the rotatable split cylinder.

9. The electrostatic chuck of claim 8, wherein the rotatable RF coupling device further comprises:
one or more insulators disposed between the grounded shield, the conductive plate, and the stationary ring.

10. The electrostatic chuck of claim 8, wherein the rotatable RF coupling device further comprises:
a gap disposed between the stationary ring and the rotatable split cylinder to facilitate capacitive coupling of RF power from the stationary ring to the rotatable split cylinder.

11. The electrostatic chuck of claim 10, wherein the rotatable RF coupling device further comprises:
a plurality of electrical taps extending through the rotatable split cylinder and coupled to the at least one chucking electrode.

12. The electrostatic chuck of claim 11, wherein the plurality of electrical taps includes three electrical taps, and wherein a first electrical tap carries positive voltage, a second electrical tap carries negative voltage, and a third electrical tap is electrically floating.

13. The electrostatic chuck of claim 6, wherein the plurality of lamps include an inner array of lamps and an independently controllable outer array of lamps.

14. The electrostatic chuck of claim 6, wherein the rotation assembly is a magnetic rotation assembly.

15. The electrostatic chuck of claim 14, wherein the magnetic rotation assembly includes an inner magnet attached to a lower portion of the shaft proximate to a second end of the shaft opposite the first end and an outer magnet disposed about the inner magnet to drive the rotation of the inner magnet.

16. The electrostatic chuck of claim 6, further comprising:
a bearing assembly disposed about the shaft.

17. The electrostatic chuck of claim 16, wherein the bearing assembly is electrically coupled to the at least one chucking electrode such that power can be fed through the bearing assembly to provide power to the at least one chucking electrode.

18. The electrostatic chuck of claim 6, further comprising:
a torsion spring disposed beneath the rotatable RF coupling device to align the rotatable RF coupling device with the electrostatic chuck.

19. The electrostatic chuck of claim 6, further comprising:
a housing surrounding the lamp housing and the metallic plate; and
a gap disposed between an outer diameter of the metallic plate and an inner surface of the housing, wherein the gap is sized such that when the metallic plate absorbs heat from the plurality of lamps, thermal expansion of the metallic plate causes the outer diameter of the metallic plate to contact the inner surface of the housing.

20. An electrostatic chuck, comprising:
a dielectric disk having a support surface to support a substrate and an opposing second surface, wherein at least one chucking electrode and one or more radio frequency (RF) bias electrodes are disposed within the dielectric disk;
a lamp housing disposed below the dielectric disk and having a plurality of lamps to heat the dielectric disk;
a metallic plate disposed below the lamp housing to absorb heat generated by the plurality of lamps;
a rotatable radio frequency (RF) coupling device extending through the lamp housing and the metallic plate and coupled to the dielectric disk at a first end of the rotatable RF coupling device to support the dielectric disk in a spaced relation to the lamp housing, wherein the rotatable RF coupling device comprises:
a conductive plate;
a rotatable split cylinder coupled to the dielectric disk to provide RF power to one or more RF bias electrodes disposed within the dielectric disk;
a plurality of RF input taps coupled to the conductive plate to couple RF power to the conductive plate;
a stationary ring coupled to the conductive plate and surrounding the rotatable split cylinder; and
a grounded shield surrounding the conductive plate, the stationary ring, and the rotatable split cylinder;

a shaft coupled to a second end of the rotatable RF coupling device at a first end of the shaft;

a housing surrounding the lamp housing and the metallic plate;

a gap disposed between an outer diameter of the metallic plate and an inner surface of the housing, wherein the gap is sized such that when the metallic plate absorbs heat from the plurality of lamps, thermal expansion of the metallic plate causes the outer diameter of the metallic plate to contact the inner surface of the housing; and a magnetic drive assembly coupled to the shaft to rotate the shaft, a portion of the RF coupling device, and the dielectric disk with respect to the lamp housing and the metallic plate.

* * * * *